(12) United States Patent
Ramakrishnan et al.

(10) Patent No.: US 7,694,257 B2
(45) Date of Patent: Apr. 6, 2010

(54) METHOD AND APPARATUS FOR DEEP SUB-MICRON DESIGN OF INTEGRATED CIRCUITS

(75) Inventors: Sivakumar Ramakrishnan, Karnataka (IN); Narasimha Murthy Padmanabhan, Karnataka (IN)

(73) Assignee: Analog Devices, Inc., Norwood, MA (US)

( * ) Notice: Subject to any disclaimer, the term of this patent is extended or adjusted under 35 U.S.C. 154(b) by 826 days.

(21) Appl. No.: 11/152,876

(22) Filed: Jun. 15, 2005

(65) Prior Publication Data

US 2006/0035456 A1    Feb. 16, 2006

Related U.S. Application Data

(60) Provisional application No. 60/601,384, filed on Aug. 13, 2004.

(51) Int. Cl.
 *G06F 17/50* (2006.01)
(52) U.S. Cl. .......................... 716/10; 716/5

(58) Field of Classification Search .................. 716/2, 716/5, 8–10; 438/622, 626, 697
See application file for complete search history.

(56) References Cited

U.S. PATENT DOCUMENTS

| | | | |
|---|---|---|---|
| 6,305,000 B1 * | 10/2001 | Phan et al. | 716/5 |
| 6,770,554 B1 * | 8/2004 | Welstand | 438/618 |
| 6,998,716 B2 * | 2/2006 | Hung | 257/773 |
| 7,037,820 B2 * | 5/2006 | Booth et al. | 438/618 |
| 7,174,526 B2 * | 2/2007 | Shrowty et al. | 716/11 |
| 2004/0049754 A1 * | 3/2004 | Liao et al. | 716/8 |

* cited by examiner

*Primary Examiner*—Vuthe Siek
(74) *Attorney, Agent, or Firm*—Goodwin Procter LLP

(57) ABSTRACT

A technique for adding filler metal polygons in metal layers on a chip area of an IC design. In one example embodiment, this is accomplished by computing a size of a filler metal polygon using chip design layout data. One or more regions on the metal layers of the IC design that do not meet metal density requirements are then identified. The identified one or more regions are then filled with one or more filler metal polygons as a function of the metal density requirement and coupling capacitance between metal lines.

26 Claims, 6 Drawing Sheets

METHOD AND APPARATUS FOR DEEP SUB-MICRON DESIGN OF INTEGRATED CIRCUITS

RELATED APPLICATION

Benefit is claimed under 35. U.S.C. 119(e) to U.S. Provisional Application Ser. No. 60/601,384, entitled "Metal coverage for deep sub-micron designs", by inventor Sivakumar Ramakrishnan et al., filed Aug. 13, 2004, which is herein incorporated in its entirety by reference for all purposes.

TECHNICAL FIELD OF THE INVENTION

The present invention relates generally to integrated circuit (IC) design, and more particularly relates to metal filler patterns for deep sub-micron IC designs.

BACKGROUND OF THE INVENTION

Signal integrity is rapidly becoming one of the important issues in IC designs, especially in very large scale integration (VLSI) physical designs. As the chip size and performance are increasing, the process feature size is reducing. This can result in a higher parasitic induced capacitance on the signal lines which can result in having a very strong impact on the design functionality. Such noise may reduce performance or even introduce logic failures into the IC system.

In IC designs, filler metal polygons (electrically inactive areas) are added to chips in order to maintain an even distribution of metal density across a chip, which reduces the potential for defects on the chip due to uneven chemical-mechanical polishing (CMP) during the chip manufacturing process. Having a certain percentage of coverage for metal has been a general requirement for foundries. Typically, metal density is maintained in the range of about 20% to 80%.

In order to meet the metal coverage requirements, chip designers generally add filler metal polygons on each metal layer in a chip without giving any consideration to coupling capacitance between metal routes and added filler metal polygons. Exemplary metal routes include power routes, clock routes, and signal routes. Typically, the size of the filler metal polygons is about 3 microns×3 microns in size. The added filler metal polygons that violate minimum spacing requirements (between the added filler metal polygon and the metal route) are removed and then checked for metal density requirements. If the metal density requirements are not met, then the above process is repeated until the metal density requirements are met. In general, the above process can become very iterative and time consuming.

In addition, the above technique often leaves the added filler metal polygons too close to the metal routes due to the effort to increase the metal density. This can lead to increased parasitic capacitance, i.e., coupling capacitance between the metal routes and the added filler metal polygons. This in turn, can affect the performance of the chip, such as reducing the frequency of operation of the chip or can affect the functionality of the design. In some instances, the frequency degradation can be as much as 10%. Thus, in the deep sub-micron range, the characteristics of the metal routes (interconnect) and the filler metal polygons can significantly dominate the overall performance of a chip.

SUMMARY OF THE INVENTION

According to an aspect of the present invention there is provided a method for allocating filler metal polygons during manufacturing of integrated circuits (ICs). The method including the steps of computing a size of a filler metal polygon using chip design layout data, identifying one or more regions on the metal layers of the IC design that do not meet metal density requirement, and filling the identified one or more regions with one or more filler metal polygons as a function of the metal density requirement.

According to another aspect of the present invention there is provided a method for overlaying filler metal polygons in metal layers of a chip area of an IC design. The method including the steps of choosing a current rectangular region located at origin (0, 0) on the metal layer, computing a metal density of the current rectangular region, determining whether the computed metal density in the current rectangular region is less than a lowest metal density requirement, computing an amount of metal density that is required to make it equal to the lowest metal density requirement by subtracting the lowest metal density requirement with the computed metal density in the current rectangular region if the computed metal density is the current rectangular region is less than the lowest metal density requirement, filling the current rectangular region with the filler metal polygons by an amount equal to the determined amount of the metal density required to make it equal to the lowest metal density requirement, and choosing a next rectangular region that is at a predetermined distance from the origin (0, 0) in the metal layer and repeating the computing, determining, and filling steps until an entire area of the metal layer is covered.

DETAILED DESCRIPTION OF THE INVENTION

In the following detailed description of the embodiments of the invention, reference is made to the accompanying drawings that form a part hereof, and in which are shown by way of illustration specific embodiments in which the invention may be practiced. These embodiments are described in sufficient detail to enable those skilled in the art to practice the invention, and it is to be understood that other embodiments may be utilized and that changes may be made without departing from the scope of the present invention. The following detailed description is, therefore, not to be taken in a limiting sense, and the scope of the present invention is defined only by the appended claims.

The terms "chip area" and "design area" are used interchangeably throughout the document. Further, the terms "overlaying the filler metal polygons" and "adding the filler metal polygons" are used interchangeably throughout the document. Furthermore, the term "poly" refers to polysilicon.

Figure 1:
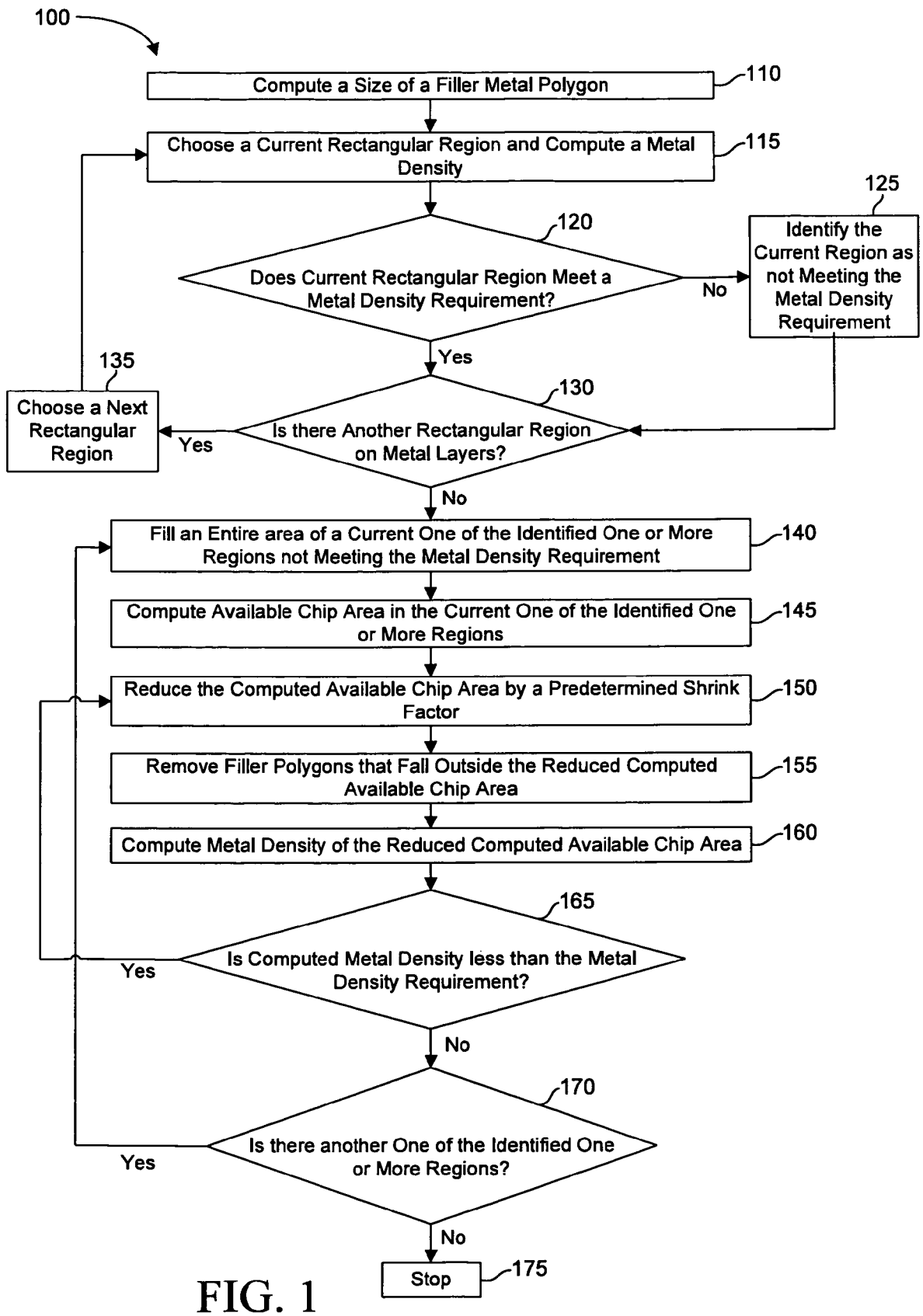
FIG. 1 is a flowchart illustrating an example method of allocating filler metal polygons in metal layers in a design area of an IC design according to an embodiment of the present invention.

FIG. 1 is a flowchart illustrating an example embodiment of a method 100 for adding filler metal polygons in metal layers of an IC design in a chip area. At step 110, the method 100 in this example embodiment computes a size of a filler metal polygon using chip design layout data. Exemplary chip design layout data includes width and spacing information of metal, poly, via, diffusion and other layers. Further the exemplary chip design layout data include sizes of transistors represented visually through polygons and the like. In these embodiments, the metal width and spacing information translates into coupling capacitance information, which can include coupling capacitance between the filler metal polygons and various metal routes, such as power routes, clock routes, signal routes, metal-to-substrate, metal-to-metal, metal-to-filler metal polygons and so on. Similarly, the resistance information includes resistance between the filler metal polygons and the metal routes. In these embodiments, the filler metal polygon includes a diffusion layer, a polysilicon layer, at least one metal layer, contacts, vias, and the like. In some embodiments, the size of the filler metal polygon computed includes a computed area of a rectangular filler metal area and/or a polygon filler metal area.

In some embodiments, the filler metal polygons are rectangular in shape. In sub-micron IC designs, the size of the rectangular filler metal polygons is about 3 micrometers×3 micrometers. In some embodiments, the width of the rectangular filler metal polygons is computed as a function of the coupling capacitance information. The length of the rectangular filler metal polygon is calculated as a function of the coupling capacitance information in the chip design layout data, which includes test structure data, received from a chip manufacturer. The selection of the size of the filler metal polygons can directly reflect the metal coverage that can be obtained on the chip area.

Generally, it is desirable to select as large a size as the IC design allows for the filler metal polygons. In addition, the spacing between the filler metal polygons is chosen as small as possible to get a highest possible metal coverage on the chip area. Also, the spacing chosen between a filler metal polygon and a metal route can influence the width and coupling capacitance with the filler metal polygon. Therefore, the width of the filler metal polygon can vary based on the IC design topology. Further, the width of the filler metal polygon depends on an available metal area for overlaying the filler metal polygons in the chip area. The length of the filler metal polygon is an independent factor and it is generally in the range of about 1 micrometer to 3 micrometers. In addition, the length of the filler metal polygons can be tweaked based on the coupling capacitance between the filler metal polygons and the metal routes used in the IC design.

Figure 2:
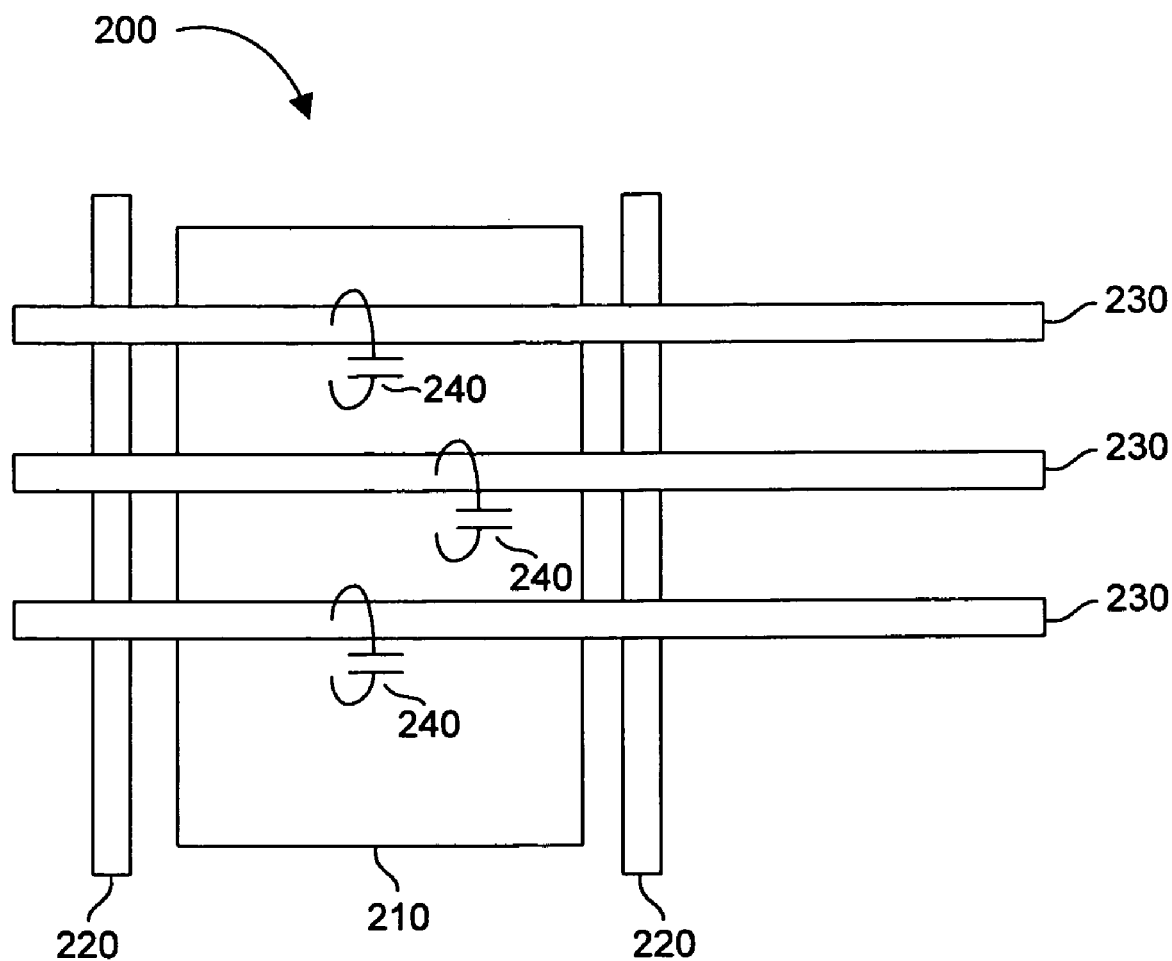
FIG. 2 is a block diagram illustrating an effect of inter-layer coupling capacitance with filler metal polygons according to an embodiment of the present invention.

Referring now to FIG. 2, there is illustrated an example portion 200 in a chip area of an IC design and the inter-layer coupling capacitance picked up between the filler metal polygon and the one or more metal layers. The example portion of the chip area 200 includes a filler metal polygon 210, metal routes 220 in metal layer 1, and metal routes 230 in metal layer 2. As shown in FIG. 2, it can be seen that the filler metal polygon 210 picks up the coupling capacitance 240 from the metal routes 230 in the metal layer 2 and also from the metal routes 220 disposed in the metal layer 1. It can also be seen that the effect of the coupling capacitance 240 can be significant as the length of the filler metal polygon increases. Therefore, the length of the filler metal polygon has to be curtailed to reduce the effect of the parasitic capacitance between the filler metal polygons and the metal routes in one or more metal layers in the design area.

In some embodiments, the test structure data is derived from the IC design by drawing various polygon dimensions and spacing and extracting the associated parasitic information.

The number of test cases required can be determined from the following equation:

$$N=(((X!)/(2!*(X-2)!))+X)*S*W$$

Wherein "N" is a number of test structure cases for two metal routes in parallel, 'S' is a number of spacings, 'W' is a number of widths, and 'X' is a number of metal layers and applies to when X>2.

The IC design can have reference metal layers above and below (for example, a first metal layer can have poly as bottom reference layer and a second metal layer as top reference layer) which can become an individual test case. The above equation can be modified to include as many reference layers as needed in the IC design.

Referring back to FIG. 1, at step 115, one or more regions on the metal layers of the IC design that do not meet a metal density requirement is then identified. In some embodiments, the metal density requirement is based on a metal density requirement of about 20% to 80% of metal in the one or more regions of the metal layers.

Figure 3:
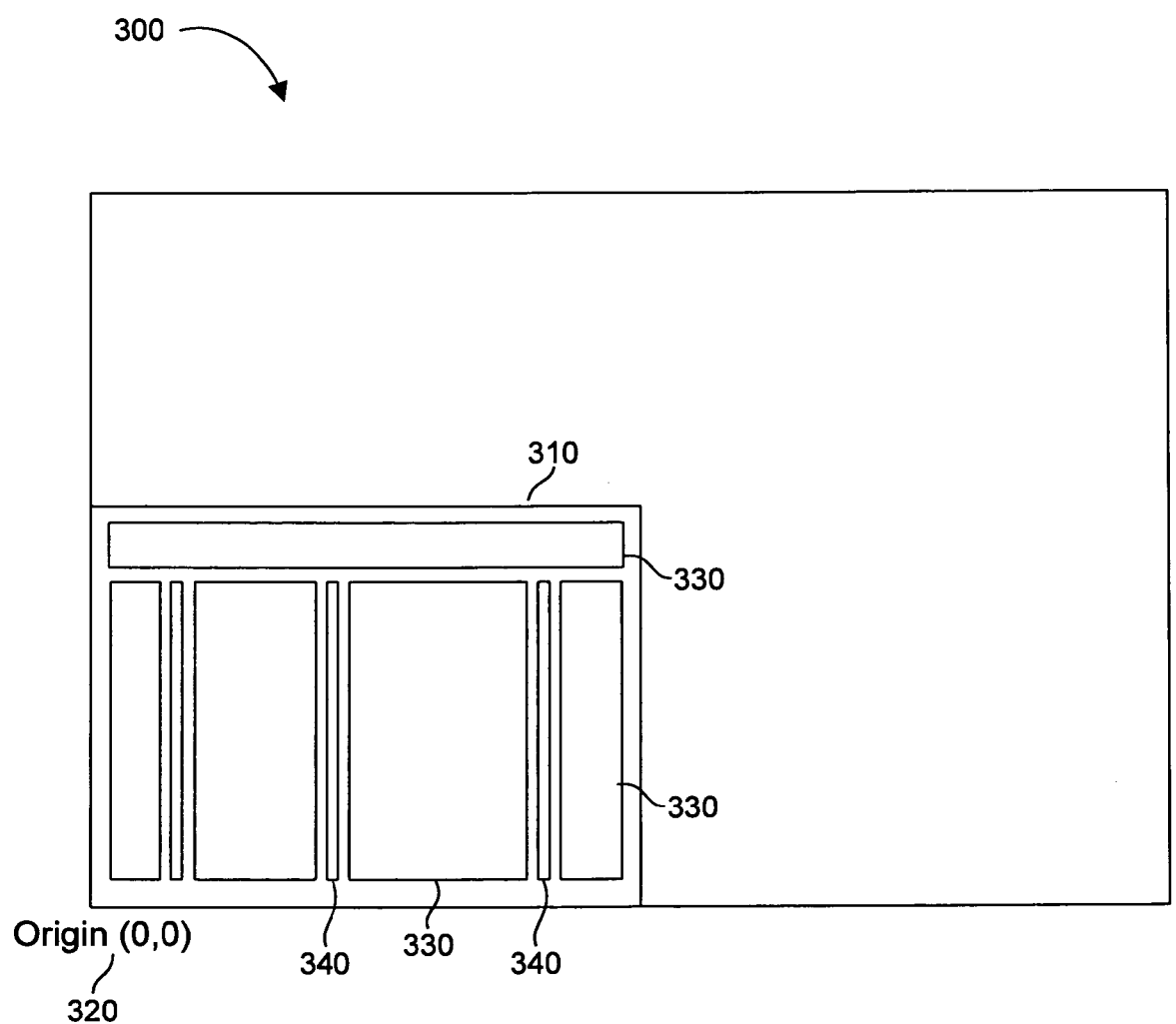
FIG. 3 is a block diagram illustrating computation of available chip area in a region of a design area of an IC design according to an embodiment of the present invention.

In some embodiments, a current rectangular region 310 located at origin (0, 0) 320 in metal layers of the chip area 300 as shown in FIG. 3 is chosen: As shown in FIG. 3, the current rectangular region 310 includes one or more available metal areas 330 and one or more metal routes 340. A metal density of the chosen current rectangular region 310 is then computed.

At step 120, the method 100 checks to see whether the computed metal density of the current rectangular region meets the metal density requirement of the IC design. Based on the determination at 120, the method 100 goes to step 125 and identifies the chosen current rectangular region as not meeting the metal density requirement set by a chip manufacturer and considers it for filling with the filler metal polygons if the metal density of the current rectangular region does not meet the metal density requirement and goes to step 130. Based on the determination at 120, if the computed metal density of the current rectangular region does meet the metal density requirement the method 100 goes to step 130.

At step 130, the method 100 checks to see whether there is another rectangular region in the metal layers that needs computation of the metal density. Based on the determination at 130, if there is another rectangular region that needs computation of the metal density the method 100 goes to step 135 and repeats steps 115-130. In these embodiments, the method 100 chooses a next rectangular region that is located at a predetermined distance from the origin. In some embodiments, the size of the rectangular region is about 200 micrometers×200 micrometers. In these embodiments, the predetermined distance is about 100 micrometers. Based on the determination at 130, if there are no other rectangular regions in the metal layers the method 100 goes to step 140.

At step 140, the identified one or more regions are filled with filler metal polygons as a function of the metal density requirement set by the chip manufacturer. In some embodiments, an entire area of the current one of the identified one or more regions are filled with the computed filler metal polygons. At step 145, available chip area for filling with the computed filler metal polygons is computed by subtracting the entire area of the current one of the identified one or more regions with associated overlapping metal routes.

In these embodiments, the metal density of the current one of the identified one or more regions that violate the metal density requirement set by the chip manufacturer is computed as follows:

$$RMD = EMD - CMD$$

Wherein RMD is a required metal density, EMD is an expected metal density and CMD is a current metal density.

In these embodiments, the following criteria is used to the meet density requirements, $$\sum_{spc=max}^{spc=min} \text{Sum of } AAspc \geq RMDarea$$

Wherein RMDarea is the area equivalent to the RMD, spc is spacing between metal lines and/or layers, min is closest distance between the filler metal polygons and the metal lines, max is a farthest spacing between the filler metal polygons and the metal lines, and AAspc refers to the available area for a given region.

The sum of available area, across all spacing, is required to be greater than the RMDarea, so that the metal density can be met by adding the computed filler metal polygons. The AAspc used in one spacing cannot be accounted for use in another spacing. A similar approach can be used if the metal density is higher than the allowed limit due to addition of filler metal polygons and removal of the filler metal polygons.

At step 150, the computed available chip area for filling the chip area with the filler metal polygons is reduced by a predetermined shrink factor. In some embodiments, the predetermined shrink factor is based on negating the metal routes. In these embodiments, the available chip area is reduced for a fixed spacing between the filler metal polygons that is derived from the test structure data received from the chip manufacturer for the IC design. Generally, the fixed spacing is in the range of about 0.2 micrometer to 2 micrometers for the submicron technology. The fixed spacing ensures that the filler metal polygons are located away from the signal metal routes to reduce the coupling capacitance between the metal routes and the filler metal polygons.

At step 155, the portion of filler metal polygons that fall outside the reduced computed available chip area are removed, after comparing the reduced available chip are with an area of the current one of the identified one or more regions. At step 160, a metal density of the reduced available chip area including remaining filler metal polygons is computed.

At step 165, the method 100 determines whether the computed metal density in the reduced available chip area is less than the metal density requirement set by the chip manufacturer. Based on the determination at step 165, if the computed metal density is less than the metal density requirement then the method goes to step 150 and repeats steps 150-165. Based on the determination at step 165, if the computed metal density is not less than the metal density requirement, then the method goes to step 170.

At step 170, the method 100 determines whether there is another one of the identified one or more regions that needs filling with the filler metal polygons. Based on the determination at step 170, if there is another one of the identified one or more regions that needs filling with the filler metal polygons, then the method 100 goes to step 140 and repeats steps 140-170. Based on the determination at step 170, if there is no other one of the identified one or more regions that needs filling with the filler metal polygons, then the method 100 goes to step 175 and stops the filling of the filler metal polygon in the chip area of the IC design.

Figure 4:
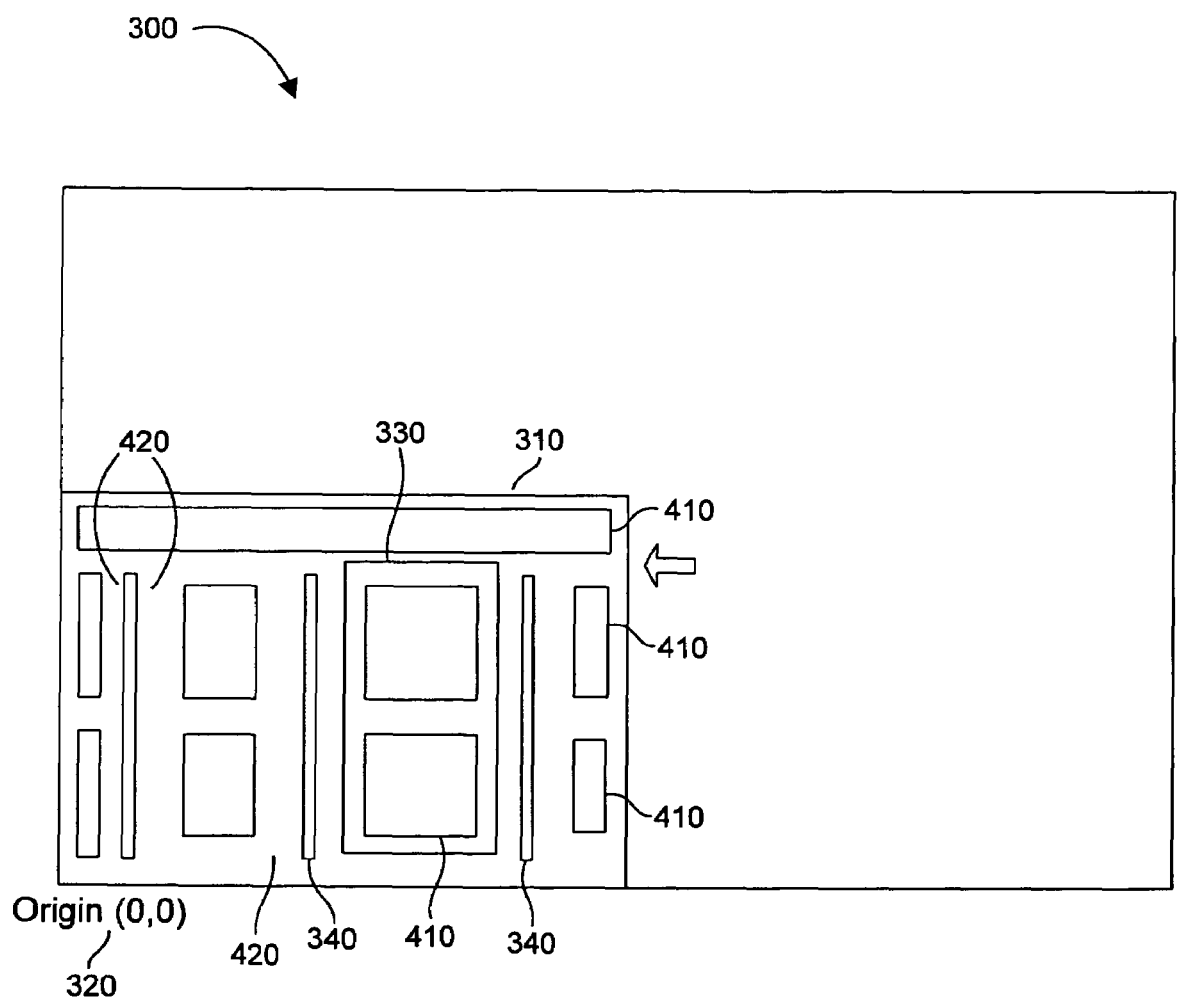
FIG. 4 is a block diagram illustrating computation of available filler metal polygon area in a region according to an embodiment of the present invention.

Referring now to FIG. 4, there is shown the filling of the filler metal polygons 410 in an available chip area of the current rectangular region 310. Also, shown is a fixed space 420 provided between the metal routes 340 and the added filler metal polygons 410.

Figure 5:
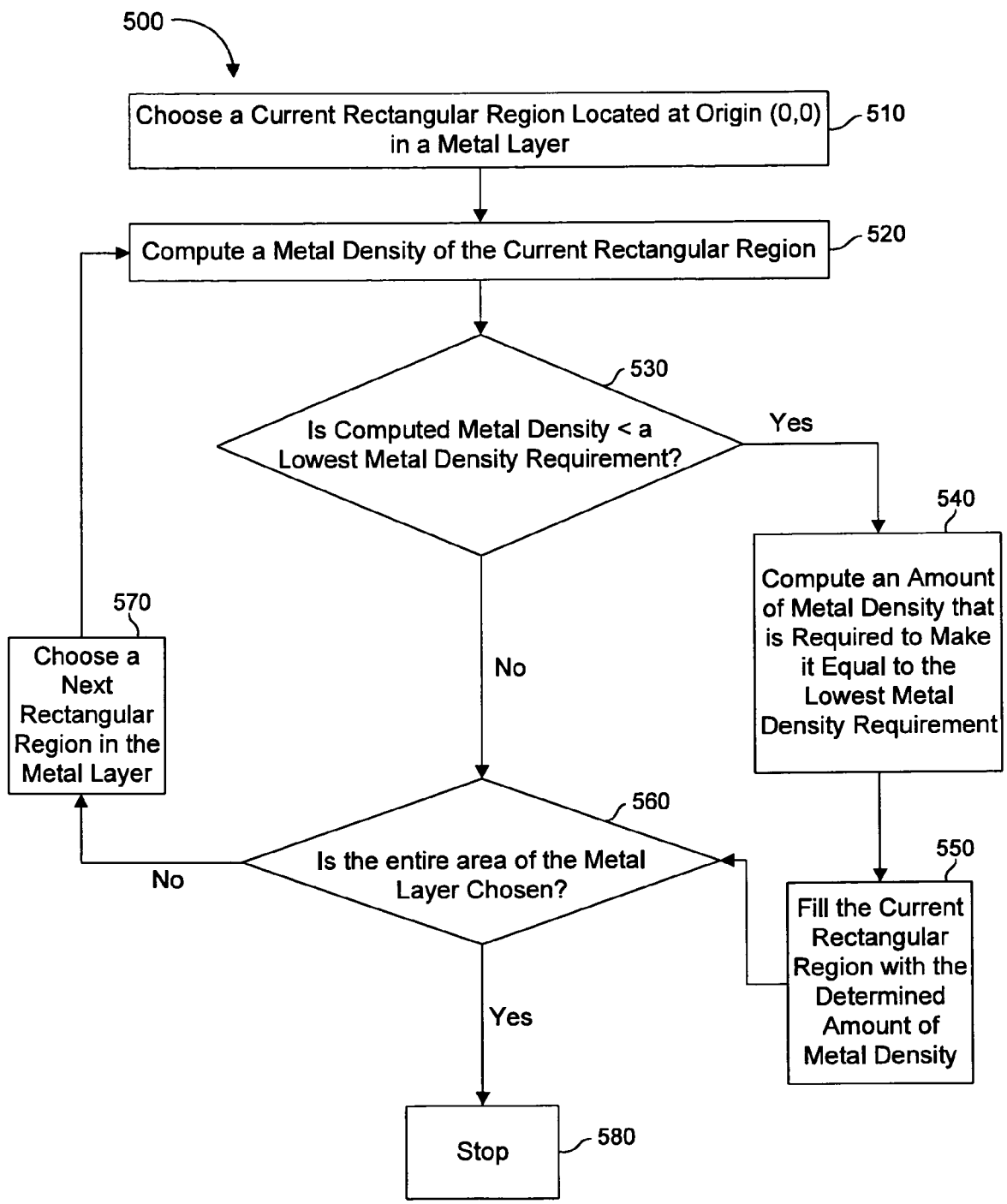
FIG. 5 is a flowchart illustrating another example method of allocating filler metal polygons in metal layers in a design area of an IC design according to an embodiment of the present invention.

FIG. 5 is a flowchart illustrating another example embodiment of a method 500 for adding filler metal polygons in metal layers of an IC design. At step 510, the method 500 in this example embodiment chooses a current rectangular region located at origin (0, 0) on a metal layer of a design area of an IC design. At step 520, a metal density of the current rectangular region is computed.

At step 530, the method 500 determines whether the computed metal density in the current rectangular region is less than a lowest metal density requirement received from a chip manufacturer for the IC design. Based on the determination at step 530, if the computed metal density in the current rectangular region is not less than the lowest metal density requirement (i.e., the computed metal density in the current region is equal to or greater than the lowest metal density requirement), then the method 500 goes to step 560.

At step 560, the method 500 determines whether there is another rectangular region in the design area that needs to be chosen for computing the metal density or whether the entire design area is covered. Based on the determination at step 560, if the entire design area is covered, then the method goes to step 580 and stops. Based on the determination at step 560, if the entire design area is not covered, then the method 500 goes to step 570 and chooses a next rectangular region located at a predetermined distance from the origin (0, 0) and repeats steps 520-560.

Based on the determination at step 530, if the computed metal density in the current rectangular region is less than the lowest metal density requirement, then the method 500 goes to step 540 and computes an amount of metal density that is required to make the computed metal density in the current rectangular region to be equal to or greater than the metal density requirement by subtracting the lowest metal density requirement with the computed metal density in the current rectangular region. At step 550, the current rectangular region is filled with the filler metal polygons by the computed amount of metal density required to make the metal density in the current rectangular region equal to or greater than the lowest of the metal density requirement. After completing the filling of the rectangular region with the filler metal polygons at step 550, the method 500 goes to step 560.

In some embodiments, the amount of the metal density requirement to make the computed metal density in the current rectangular region to be equal to or greater than the metal density requirement is as follows:

The available area (AA) in the current rectangular region is filled with the filler metal polygons in the order of a decreasing area. This technique facilitates in filling the current rectangular area with larger filler metal polygons first and then followed by filling with smaller filler metal polygons. Each time the available area is filled with the polygons, the added area is compared against the RMDarea. The filling is stopped when the computed metal density is equal to the lowest of the metal density requirement.

In these embodiments, a filler metal polygon (FMP) area, i.e., the area of a single polygon, is determined by using the equation:

$$FMParea = APA - PSA$$

wherein APA is an available polygon area and PSA is a polygon space area.

For a given AA, the total filler metal polygon area is computed as below:

FMPtotarea=ΣFMParea in the given AA

To meet the above metal density criteria the following condition has to be met, $$RMDarea - \sum_{spcarea=max}^{spcarea=min} FMPtotarea(spcarea) <= 0$$

wherein spcarea=max to min means FMPtotarea for all AA that is to be added cumulatively in the order of decreasing area.

The above condition is checked for each window. If the metal density criteria is not met with the max spacing, the next available spacing is applied to the available area and the polygons are filled and checked again as described above for metal density criteria. The entire process is automated and can have no impact or very minimal impact on the parasitic capacitance of the signals without affecting the performance of the chip.

Various embodiments of the present invention can be implemented in software, which may be run in the environment shown in FIG. 6, which is described below or in any other suitable computing environment. The embodiments of the present invention are operable in a number of general-purpose or special-purpose computing environments. For example, these may include personal computers, general-purpose computers, server computers, hand-held devices (including, but not limited to, telephones and personal digital assistants (PDAs) of all types), laptop devices, multi-processors, microprocessors, set-top boxes, programmable consumer electronics, network computers, minicomputers, mainframe computers, distributed computing environments and the like to execute code stored on a computer-readable medium. Furthermore, embodiments of the present invention may be implemented in part or in whole as machine-executable instructions, such as program modules that are executed by a computer. Generally, program modules include routines, programs, objects, components, data structures, and the like to perform particular tasks or to implement particular abstract data types. In a distributed computing environment, program modules may be located in local or remote storage devices.

Figure 6:
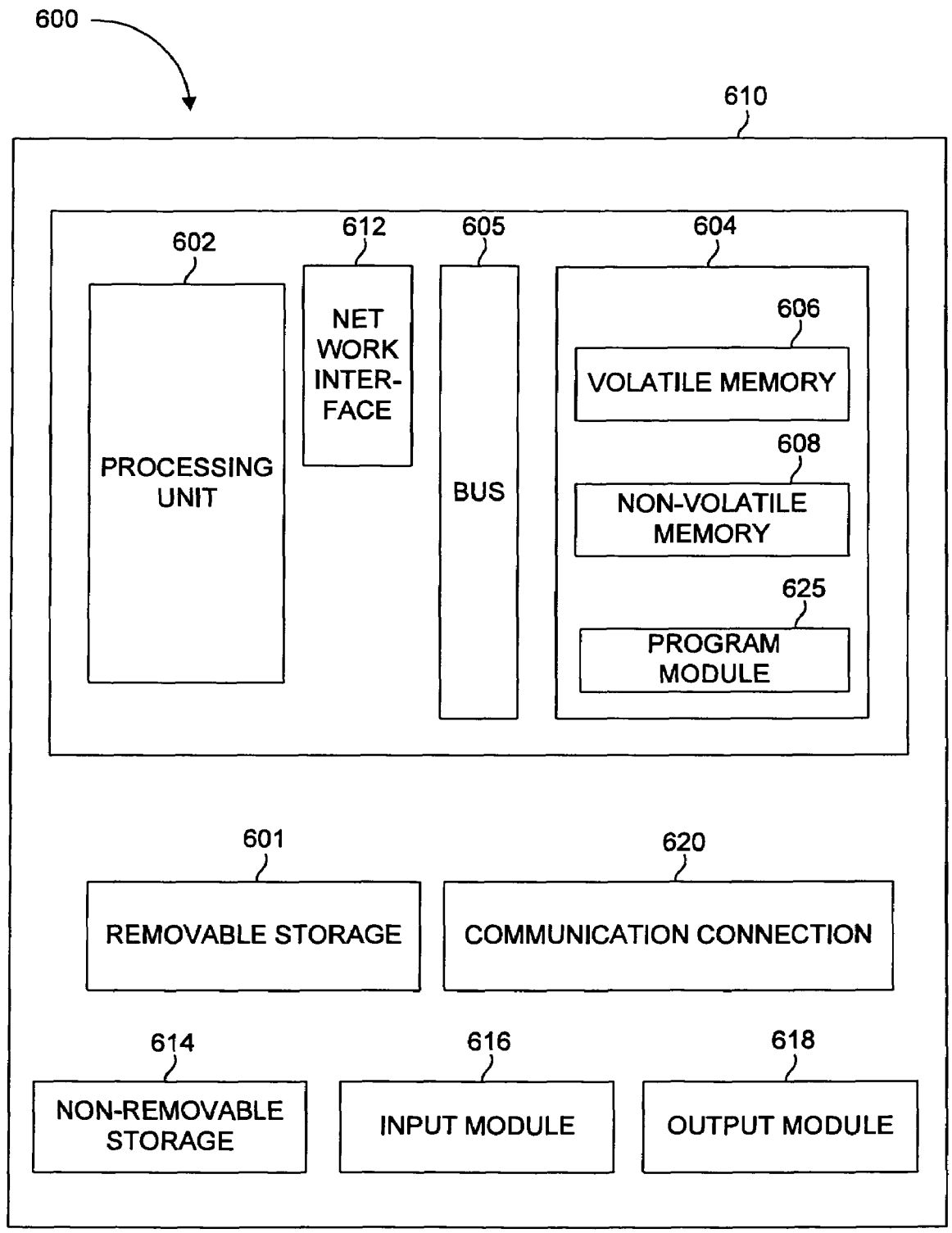
FIG. 6 is a block diagram of a typical computer system used for implementing embodiments shown in FIGS. 1 and 5.

FIG. 6 shows an example of a suitable computing system environment for implementing embodiments of the present invention. FIG. 6 and the following discussion are intended to provide a brief, general description of a suitable computing environment in which certain embodiments of the inventive concepts contained herein may be implemented.

A general computing device, in the form of a computer 610, may include a processing unit 602, memory 604, removable storage 601, and non-removable storage 614. Computer 610 additionally includes a bus 605 and a network interface (NI) 612.

Computer 610 may include or have access to a computing environment that includes one or more user input modules 616, one or more output modules 618, and one or more communication connections 620 such as a network interface card or a USB connection. The one or more output modules 618 can be a display device of a computer, computer monitor, TV screen, plasma display, LCD display, display on a digitizer, display on an electronic tablet, and the like. The computer 610 may operate in a networked environment using the communication connection 620 to connect to one or more remote computers. A remote computer may include a personal computer, server, router, network PC, a peer device or other network node, and/or the like. The communication connection may include a Local Area Network (LAN), a Wide Area Network (WAN), and/or other networks.

The memory 604 may include volatile memory 606 and non-volatile memory 608. A variety of computer-readable media may be stored in and accessed from the memory elements of computer 610, such as volatile memory 606 and non-volatile memory 608, removable storage 601 and non-removable storage 614. Computer memory elements can include any suitable memory device(s) for storing data and machine-readable instructions, such as read only memory (ROM), random access memory (RAM), erasable programmable read only memory (EPROM), electrically erasable programmable read only memory (EEPROM), hard drive, removable media drive for handling compact disks (CDs), digital video disks (DVDs), diskettes, magnetic tape cartridges, memory cards, Memory Sticks™, and the like; chemical storage; biological storage; and other types of data storage.

"Processor" or "processing unit," as used herein, means any type of computational circuit, such as, but not limited to, a microprocessor, a microcontroller, a complex instruction set computing (CISC) microprocessor, a reduced instruction set computing (RISC) microprocessor, a very long instruction word (VLIW) microprocessor, explicitly parallel instruction computing (EPIC) microprocessor, a graphics processor, a digital signal processor, or any other type of processor or processing circuit. The term also includes embedded controllers, such as generic or programmable logic devices or arrays, application specific ICs, single-chip computers, smart cards, and the like.

Embodiments of the present invention may be implemented in conjunction with program modules, including functions, procedures, data structures, application programs, etc., for performing tasks, or defining abstract data types or low-level hardware contexts.

Machine-readable instructions stored on any of the above-mentioned storage media are executable by the processing unit 602 of the computer 610. For example, a program module 625 may include machine-readable instructions capable of adding filler metal polygons on a chip area according to the teachings and herein described embodiments of the present invention. In one embodiment, the program module 625 may be included on a CD-ROM and loaded from the CD-ROM to a hard drive in non-volatile memory 608. The machine-readable instructions cause the computer 610 to encode according to the various embodiments of the present invention. As shown, the program module 625 includes instructions to overlay filler metal polygons on metal layers of a design area in an IC design according to various embodiments of the present invention.

The operation of the computer system 600 for adding the filler metal polygons on the chip area is explained in more detail with reference to FIGS. 1 and 5.

The above-described methods and apparatus provide various techniques to overlay filler metal polygons on a chip area during an IC design. The above process significantly reduces parasitic capacitance induced as a result of adding the filler metal polygons while satisfying the metal density constraints imposed by the chip manufacturer. In addition, the above process achieves the improved addition of filler metal polygons on the chip area by keeping the size of the filler metal polygon as large as possible and reducing the spacing between the filler metal polygons as small as possible. The above process achieves an improved scheme for overlaying the filler metal polygons in a chip area by negating the metal routes from the metal area and shrinking the available metal area by a predetermined shrink factor to reduce coupling capacitance with the metal routes.

It is to be understood that the above description is intended to be illustrative, and not restrictive. Many other embodiments will be apparent to those of skill in the art upon reviewing the above description. The scope of the subject matter should, therefore, be determined with reference to the following claims, along with the full scope of equivalents to which such claims are entitled.

As shown herein, the present invention can be implemented in a number of different embodiments, including various methods, an apparatus, and a system. Other embodiments will be readily apparent to those of ordinary skill in the art. The elements, algorithms, and sequence of operations can all be varied to suit particular requirements. The operations described above with respect to the method illustrated in FIGS. 1 and 5 can be performed in a different order from those shown and described herein.

FIGS. 1-6 are merely representational and are not drawn to scale. Certain proportions thereof may be exaggerated, while others may be minimized. FIGS. 1-6 illustrate various embodiments of the invention that can be understood and appropriately carried out by those of ordinary skill in the art.

It is emphasized that the Abstract is provided to comply with 37 C.F.R. § 1.72(b) requiring an Abstract that will allow the reader to quickly ascertain the nature and gist of the technical disclosure. It is submitted with the understanding that it will not be used to interpret or limit the scope or meaning of the claims.

In the foregoing detailed description of the embodiments of the invention, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the detailed description of the embodiments of the invention, with each claim standing on its own as a separate preferred embodiment.

The above description is intended to be illustrative, and not restrictive. Many other embodiments will be apparent to those skilled in the art. The scope of the invention should therefore be determined by the appended claims, along with the full scope of equivalents to which such claims are entitled.

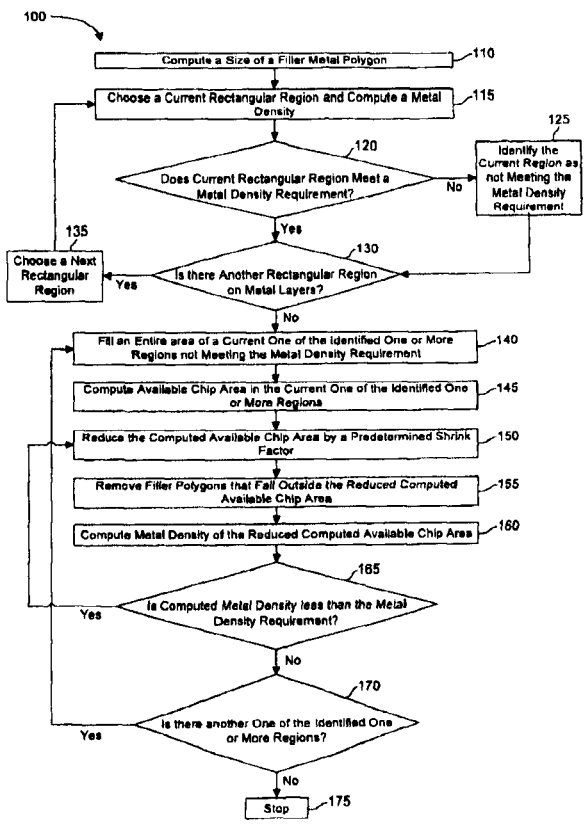

The invention claimed is:

1. A method for adding filler metal polygons in metal layers of an integrated circuit (IC) design in a chip area comprising the following acts executed by a computer system:
    computing a size of a filler metal polygon using chip design layout data;
    identifying one or more regions on the metal layers of the IC design that do not meet a metal density requirement set by a chip manufacturer;
    filling an entire area of a current one of the identified one or more regions with the computed filler metal polygons;
    computing available chip area for filling with the computed filler metal polygons by subtracting the entire area of the current one of the identified one or more regions with associated overlapping metal route areas;
    reducing the computed available chip area by a predetermined shrink factor as a function of the design layout data to form a reduced available chip area;
    comparing the reduced available chip area with the available chip area of the current one of the identified one or more regions and removing filler metal polygons that fall outside the reduced available chip area;
    computing a metal density of the reduced available chip area including remaining filler metal polygons;
    determining whether the computed metal density of the reduced available chip area is less than the metal density requirement;
    if so, then repeating the reducing, comparing, computing, and determining steps by further reducing the reduced available chip area with the predetermined shrink factor until the computed metal density of the reduced available chip area is equal to or less than the metal density requirement; and
    if not, then repeating the filling, computing available chip area, reducing, comparing, computing the metal density, and determining steps for a next one of the identified one or more regions until all of the identified one or more regions are filled with filler metal polygons that meet the metal density requirement.

2. The method of claim 1, wherein the filler metal polygon is disposed in a metal layer for which the metal density requirement has to be satisfied.

3. The method of claim 1, wherein the chip design layout data comprises parameters selected from the group consisting of width and spacing information of metal, width and spacing information of poly, width and spacing information of via, and visually represented sizes of transistors.

4. The method of claim 1, wherein, in computing the filler metal polygon size, the filler metal polygon comprises an area selected from the group consisting of a rectangular filler metal area and a polygon filler metal area.

5. The method of claim 4, wherein computing the rectangular filler metal polygon size using the chip design layout data comprises:
    computing a width of the rectangular filler metal polygon as a function of the coupling capacitance information; and
    computing a length of the rectangular filler metal polygon as a function of the coupling capacitance information.

6. The method of claim 1, wherein identifying the one or more regions on the metal layers of the IC design tat do not meet the metal density requirement comprises:
    identifying one or more rectangular regions on the metal layers of the chip area of the IC design that do not meet the metal density requirements, wherein the metal density requirement is in the range of about 20% to 80% of metal for a specific process technology.

7. The method of claim 1, wherein the region is a rectangular area, wherein a size of the rectangular area is about 200 micrometers×200 micrometers.

8. The method of claim 7, wherein the predetermined distance is about 100 micrometers.

9. A method for adding filler metal polygons in a metal layer of an IC design in a design area, comprising the following acts executed by a computer system:
    choosing a current rectangular region located at origin (0, 0) on the metal layer;
    computing a metal density of the current rectangular region;
    determining whether the computed metal density in the current rectangular region is less than a lowest metal density requirement received from a chip manufacturer for the IC design;
    if so, then computing an amount of metal density that is required to make the metal density equal to or greater than the lowest metal density requirement by subtracting the lowest metal density requirement with the computed metal density in the current rectangular region;

filling the current rectangular region with the filler metal polygons by an amount equal to or greater than the computed amount of the metal density required to make the metal density equal to the lowest metal density requirement and as a function of the coupling capacitance information; and choosing a next rectangular region that is at a predetermined distance from the origin (0, 0) in the metal layer and repeating the computing, determining, computing, and filling steps until an entire area of the metal layer is covered.

10. The method of claim 9, further comprising:
if not, then choosing the next rectangular region that is at the predetermined distance from the origin (0, 0) in the metal layer and repeating the computing, determining, computing, and filling steps until the entire area of the metal layer is covered.

11. The method of claim 9, wherein the filler metal polygon comprises a diffusion layer, a polysilicon layer, at least one metal layers, contacts, and vias.

12. The method of claim 9, wherein computing the metal density of the current rectangular region comprises computing a rectangular filler metal area to determine the metal density of the current rectangular region.

13. The method of claim 12, wherein, in identifying one or more regions on the metal layers, the region is a rectangular area, wherein a size of the rectangular area is about 200 micrometers×200 micrometers.

14. An article comprising;
a storage medium having instructions that, when executed by a computing platform, result in execution of a method comprising:
    computing a size of a filler metal polygon using chip design layout data;
    identifying one or more regions on the metal layers of the IC design that do not meet a metal density requirement set by a chip manufacturer;
    filling an entire area of a current one of the identified one or more regions with the computed filler metal polygons;
    computing available chip area for filling with the computed filler metal polygons by subtracting the entire area of the current one of the identified one or more regions with associated overlapping metal route areas;
    reducing the computed available chip area by a predetermined shrink factor as a function of the design layout data to form a reduced available chip area;
    comparing the reduced available chip area with the available chip area of the current one of the identified one or more regions and removing filler metal polygons that fall outside the reduced available chip area;
    computing a metal density of the reduced available chip area including remaining filler metal polygons;
    determining whether the computed metal density of the reduced available chip area is less than the metal density requirement;
    if so, then repeating the reducing, comparing, computing, and determining steps by further reducing the reduced available chip area with. the predetermined shrink factor until the computed metal density of the reduced available chip area is equal to or less than the metal density requirement; and <if not, then repeating the filling, computing available chip area, reducing, comparing, computing the metal density, and determining steps for a next one of the identified one or more regions until all of the identified one or more regions are filled with filler metal polygons that meet the metal density requirement.

15. The article of claim 14, wherein the filler metal polygon is disposed in a metal layer for which the metal density requirement has to be satisfied.

16. The article of claim 14, wherein the chip design layout data comprises parameters selected from the group consisting of width and spacing information of metal, width and spacing information of poly, width and spacing information of via, and visually represented sizes of transistors.

17. The article of claim 14, wherein, in computing the filler metal polygon size, the filler metal polygon comprises an area selected from the group consisting of a rectangular filler metal area and a polygon filler metal area.

18. The article of claim 17, wherein computing the rectangular filler metal polygon size using the chip design layout data comprises:
    computing a width of the rectangular filler metal polygon as a function of the coupling capacitance information; and
    computing a length of the rectangular filler metal polygon as a function of the coupling capacitance information.

19. The article of claim 14, wherein identifying the one or more regions on the metal layers of the IC design that does not meet the metal density requirement comprises:
    identifying one or more rectangular regions on the metal layers of the chip area of the IC design that does not meet the metal density requirements, wherein the metal density requirement is in the range of about 20% to 80% of metal.

20. The article of claim 19, wherein identifying the one or more rectangular regions on the metal layers of the IC design that do not meet the metal density requirement comprises:
    choosing a current rectangular region located at origin (0, 0) and computing a metal density of the current rectangular region;
    determining whether the metal density of the current rectangular region meets the metal density requirement;
    if not, then identifying the current rectangular region as not meeting the metal density requirement and choosing a next rectangular region that is at a predetermined distance from the origin (0, 0) and repeating the choosing and the determining steps until the entire metal layers are chosen; and
    if so, then choosing a next rectangular region that is at a predetermined distance from the origin (0, 0) and repeating the determining, identifying, and choosing steps until the entire area of the metal layers are chosen.

21. A computer system comprising:
a network interface;
an input module coupled to the network interface that receives input data via the network interface;
a processing unit; and
a memory coupled to the processor, the memory having stored therein code which when decoded by the processor, the code causes the processor to perform a method comprising:
    computing a size of a filler metal polygon using chip design layout data;
    identifying one or more regions on the metal layers of the IC design that do not meet a metal density requirement set by a chip manufacturer;

filling an entire area of a current one of the identified one or more regions with the computed filler metal polygons;

computing available chip area for filling with the computed filler metal polygons by subtracting the entire area of the current one of the identified one or more regions with associated overlapping metal route areas;

reducing the computed available chip area by a predetermined shrink factor as a function of the design layout data to form a reduced available chip area;

comparing the reduced available chip area with the available chip area of the current one of the identified one or more regions and removing filler metal polygons that fall outside the reduced available chip area;

computing a metal density of the reduced available chip area including remaining filler metal polygons;

determining whether the computed metal density of the reduced available chip area is less than the metal density requirement;

if so, then repeating the reducing, comparing, computing, and determining steps by further reducing the reduced available chip area with the predetermined shrink factor until the computed metal density of the reduced available chip area is equal to or less than the metal density requirement; and if not, then repeating the filling, computing available chip area, reducing, comparing, computing the metal density, and determining steps for a next one of the identified one or more regions until all of the identified one or more regions are filled with filler metal polygons that meet the metal density requirement.

22. The system of claim 21, wherein the filler metal polygon is disposed in a metal layer for which the metal density requirement has to be satisfied.

23. The system of claim 21, wherein the chip design layout data comprises parameters selected from the group consisting of width and spacing information of metal, width and spacing information of poly, width and spacing information of via, and visually represented sizes of transistors.

24. The system of claim 21, wherein, in computing the filler metal polygon size, the filler metal polygon comprises an area selected from the group consisting of a rectangular filler metal area and a polygon filler metal area.

25. The system of claim 24, wherein computing the rectangular filler metal polygon size using the chip design layout data comprises:

computing a width of the rectangular filler metal polygon as a function of the coupling capacitance information; and computing a length of the rectangular filler metal polygon as a function of the coupling capacitance information.

26. The system of claim 25, wherein identifying the one or more rectangular regions on the metal layers of the IC design that do not meet the metal density requirement comprises:

choosing a current rectangular region located at origin (0, 0) and computing a metal density of the current rectangular region;

determining whether the metal density of the current rectangular region meets the metal density requirement;

if not, then identifying the current rectangular region as not meeting the metal density requirement and choosing a next rectangular region that is at a predetermined distance from the origin (0, 0) and repeating the choosing and the determining steps until the entire metal layers are chosen; and if so, then choosing a next rectangular region that is at a predetermined distance from the origin (0, 0) and repeating the determining, identifying, and choosing steps until the entire area of the metal layers are chosen.

* * * * *

UNITED STATES PATENT AND TRADEMARK OFFICE
CERTIFICATE OF CORRECTION

| | | |
|---|---|---|
| PATENT NO. | : 7,694,257 B2 | Page 1 of 2 |
| APPLICATION NO. | : 11/152876 | |
| DATED | : April 6, 2010 | |
| INVENTOR(S) | : Sivakumar Ramakrishnan et al. | |

It is certified that error appears in the above-identified patent and that said Letters Patent is hereby corrected as shown below:

Delete the title page and substitute therefore the attached title page showing the corrected number of claims in the patent.

In Claim 6, column 10, line 43, replace "of the IC design tat do not" with --of the IC design that do not--.

In column 14, line 36, insert the following claim:

--27. The method of claim 6, wherein identifying the one or more rectangular regions on the metal layers of the IC design that do not meet the metal density requirement comprises:
    choosing a current rectangular region located at origin (0,0) and computing a metal density of the current rectangular region;
    determining whether the metal density of the current rectangular region meets the metal density requirement;
    if not, then identifying the current rectangular region as not meeting the metal density requirement and choosing a next rectangular region that is at a predetermined distance from the origin (0,0) and repeating the choosing and the determining steps until the entire metal layers are chosen; and
    if so, then choosing a next rectangular region that is at a predetermined distance from the origin (0,0) and repeating the determining, identifying, and choosing steps until the entire area of the metal layers is chosen.--.

Signed and Sealed this

Eighth Day of June, 2010

David J. Kappos
*Director of the United States Patent and Trademark Office*

CERTIFICATE OF CORRECTION (continued)

(12) United States Patent  (10) Patent No.: US 7,694,257 B2
Ramakrishnan et al.  (45) Date of Patent: Apr. 6, 2010

(54) METHOD AND APPARATUS FOR DEEP SUB-MICRON DESIGN OF INTEGRATED CIRCUITS

(75) Inventors: Sivakumar Ramakrishnan, Karnataka (IN); Narasimha Murthy Padmanabhan, Karnataka (IN)

(73) Assignee: Analog Devices, Inc., Norwood, MA (US)

( * ) Notice: Subject to any disclaimer, the term of this patent is extended or adjusted under 35 U.S.C. 154(b) by 826 days.

(21) Appl. No.: 11/152,876

(22) Filed: Jun. 15, 2005

(65) Prior Publication Data

US 2006/0035456 A1  Feb. 16, 2006

Related U.S. Application Data

(60) Provisional application No. 60/601,384, filed on Aug. 13, 2004.

(51) Int. Cl.
*G06F 17/50* (2006.01)

(52) U.S. Cl. .............................. 716/10; 716/5

(58) Field of Classification Search ............... 716/2, 716/5, 8–10; 438/622, 626, 697
See application file for complete search history.

(56) References Cited

U.S. PATENT DOCUMENTS

| 6,305,000 | B1 * | 10/2001 | Phan et al. ............ 716/5 |
| 6,770,554 | B1 * | 8/2004 | Welstand ............ 438/618 |
| 6,998,716 | B2 * | 2/2006 | Hung ............ 257/773 |
| 7,037,820 | B2 * | 5/2006 | Booth et al. ............ 438/618 |
| 7,174,526 | B2 * | 2/2007 | Shrowty et al. ............ 716/11 |
| 2004/0049754 | A1 * | 3/2004 | Liao et al. ............ 716/8 |

* cited by examiner

*Primary Examiner*—Vuthe Siek
(74) *Attorney, Agent, or Firm*—Goodwin Procter LLP

(57) ABSTRACT

A technique for adding filler metal polygons in metal layers on a chip area of an IC design. In one example embodiment, this is accomplished by computing a size of a filler metal polygon using chip design layout data. One or more regions on the metal layers of the IC design that do not meet metal density requirements are then identified. The identified one or more regions are then filled with one or more filler metal polygons as a function of the metal density requirement and coupling capacitance between metal lines.

27 Claims, 6 Drawing Sheets